US011968321B2

(12) United States Patent
Kuhn et al.

(10) Patent No.: US 11,968,321 B2
(45) Date of Patent: Apr. 23, 2024

(54) TASK COMPLETION IN A TRACKING DEVICE ENVIRONMENT

(71) Applicant: Tile, Inc., San Mateo, CA (US)

(72) Inventors: Felipe Knorr Kuhn, Dublin, CA (US); Wayne Patterson, Burlingame, CA (US)

(73) Assignee: Tile, Inc., San Mateo, CA (US)

( * ) Notice: Subject to any disclaimer, the term of this patent is extended or adjusted under 35 U.S.C. 154(b) by 0 days.

(21) Appl. No.: 18/311,239

(22) Filed: May 3, 2023

(65) Prior Publication Data

US 2023/0275987 A1 Aug. 31, 2023

Related U.S. Application Data

(63) Continuation of application No. 17/700,487, filed on Mar. 22, 2022, now Pat. No. 11,683,410, which is a (Continued)

(51) Int. Cl.
*G08B 1/08* (2006.01)
*A63F 13/216* (2014.01)
(Continued)

(52) U.S. Cl.
CPC ....... *H04M 1/72457* (2021.01); *A63F 13/216* (2014.09); *A63F 13/332* (2014.09); (Continued)

(58) Field of Classification Search
CPC ...... A63F 13/216; A63F 13/332; A63F 13/35; G03F 1/24; G03F 7/2043; G03F 7/70166; G06Q 10/063114; H04M 1/72403; H04M 1/72412; H04M 1/72427; H04M 1/72457; H04W 4/023
(Continued)

(56) References Cited

U.S. PATENT DOCUMENTS 7,817,038 B2 10/2010 Torning
8,508,363 B2 8/2013 Raniere
(Continued)

OTHER PUBLICATIONS

United States Office Action, U.S. Appl. No. 16/016,549, filed Apr. 17, 2019, 11 pages.
(Continued)

*Primary Examiner* — Naomi J Small
(74) *Attorney, Agent, or Firm* — Fenwick & West LLP

(57) ABSTRACT

A set of tracking devices can be placed within a geographic area as part of a scavenger hunt. A user with a mobile device can traverse the area, and when the user moves within a threshold proximity or communicative range of a tracking device, the mobile device can receive a communication from the tracking device identifying the tracking device. In response to determining that the tracking device is part of the set of tracking devices and thus part of the scavenger hunt, the mobile device can modify a tracking device interface displaying a representation of the tracking device to indicate that the tracking device has been found. In response to each tracking device being found, the mobile device can modify the tracking device interface to indicate that the scavenger hunt has been completed.

20 Claims, 7 Drawing Sheets

Related U.S. Application Data continuation of application No. 17/019,200, filed on Sep. 12, 2020, now Pat. No. 11,316,970, which is a continuation of application No. 16/521,454, filed on Jul. 24, 2019, now Pat. No. 10,812,649, which is a continuation of application No. 16/016,549, filed on Jun. 23, 2018, now Pat. No. 10,404,851.

(60) Provisional application No. 62/530,019, filed on Jul. 7, 2017.

(51) Int. Cl.
| | | |
|---|---|---|
| *A63F 13/332* | (2014.01) | |
| *G03F 1/24* | (2012.01) | |
| *G03F 7/00* | (2006.01) | |
| *G03F 7/20* | (2006.01) | |
| *H04M 1/72403* | (2021.01) | |
| *H04M 1/72412* | (2021.01) | |
| *H04M 1/72427* | (2021.01) | |
| *H04M 1/72457* | (2021.01) | |
| *H04W 4/02* | (2018.01) | |
| *G06Q 10/0631* | (2023.01) | |

(52) U.S. Cl.
CPC ............. *G03F 1/24* (2013.01); *G03F 7/2043* (2013.01); *G03F 7/70166* (2013.01); *H04M 1/72403* (2021.01); *H04M 1/72412* (2021.01); *H04M 1/72427* (2021.01); *H04W 4/023* (2013.01); *G06Q 10/063114* (2013.01)

(58) Field of Classification Search
USPC ..................................................... 340/539.13
See application file for complete search history.

(56) References Cited

U.S. PATENT DOCUMENTS

| | | |
|---|---|---|
| 8,810,392 B1 | 8/2014 | Teller et al. |
| 9,392,404 B2 | 7/2016 | Daoura et al. |
| 9,525,970 B2 | 12/2016 | Farley et al. |
| 10,244,097 B2 | 3/2019 | Logan |
| 2010/0093273 A1 | 4/2010 | Hohl |
| 2012/0322380 A1 | 12/2012 | Nannarone et al. |
| 2014/0099921 A1 | 4/2014 | Weiss |
| 2015/0332573 A1 | 11/2015 | Selmanovic et al. |
| 2015/0364026 A1 | 12/2015 | Rubin et al. |
| 2016/0105764 A1 | 4/2016 | Evans et al. |
| 2016/0105765 A1* | 4/2016 | Farley .................. H04W 4/029 455/456.1 |
| 2016/0239733 A1 | 8/2016 | Hertz et al. |
| 2016/0286358 A1 | 9/2016 | Weiss et al. |
| 2017/0270589 A1* | 9/2017 | Grueneberg ......... G06Q 20/322 |
| 2017/0278047 A1* | 9/2017 | Welty .................. G05D 1/0011 |
| 2018/0060767 A1 | 3/2018 | Dillard et al. |

OTHER PUBLICATIONS

United States Office Action, U.S. Appl. No. 16/521,454, filed Jun. 2, 2020, 14 pages.
United States Office Action, U.S. Appl. No. 16/521,454, filed Apr. 21, 2020, 12 pages.
United States Office Action, U.S. Appl. No. 16/521,454, filed Mar. 26, 2020, 11 pages.
United States Office Action, U.S. Appl. No. 16/521,454, filed Feb. 18, 2020, 27 pages.
United States Office Action, U.S. Appl. No. 17/019,200, filed Sep. 13, 2021, 14 pages.
United States Office Action, U.S. Appl. No. 17/700,487, filed Oct. 14, 2022, 6 pages.

* cited by examiner

TASK COMPLETION IN A TRACKING DEVICE ENVIRONMENT

CROSS REFERENCE TO RELATED APPLICATION

This application is a continuation of U.S. application Ser. No. 17/700,487, filed Mar. 22, 2022, now U.S. Pat. No. 11,683,410, which is a continuation of U.S. application Ser. No. 17/019,200, filed Sep. 12, 2020, now U.S. Pat. No. 11,316,970, which is a continuation of U.S. application Ser. No. 16/521,454, filed Jul. 24, 2019, now U.S. Pat. No. 10,812,649, which application is a continuation of U.S. application Ser. No. 16/016,549, filed Jun. 23, 2018, now U.S. Pat. No. 10,404,851, which application claims the benefit of U.S. Provisional Application No. 62/530,019, filed Jul. 7, 2017, the contents of which are incorporated by reference herein in their entirety.

BACKGROUND

This disclosure relates generally to tracking devices, and more specifically, to tracking the completion of tasks or the presence of a user at locations.

Electronic tracking devices have created numerous ways for people to track the locations of people and/or objects. For example, a user can use GPS technology to track a device remotely or determine a location of the user. In another example, a user can attach a tracking device to an important object, such as keys or a wallet, and use the features of the tracking device to more quickly locate the object, (e.g., if it becomes lost).

However, traditional tracking devices and corresponding systems suffer from one or more disadvantages. For instance, a battery of the tracking device may be difficult to recharge or replace, thus limiting the lifespan of the tracking device to the length of time the battery can power the tracking device. Accordingly, there is a need to improve performance in order to reduce the power requirements of the tracking device, thereby extending the amount of time the battery can power the tracking device, and thus extending the lifespan of the tracking device itself.

The figures depict various embodiments of the present invention for purposes of illustration only. One skilled in the art will readily recognize from the following discussion that alternative embodiments of the structures and methods illustrated herein may be employed without departing from the principles of the invention described herein.

DETAILED DESCRIPTION

Environment Overview

Embodiments described herein detail functionality associated with a tracking device. A user can attach a tracking device to or enclose the tracking device within an object, such as a wallet, keys, a car, a bike, a pet, or any other object that the user wants to track. The user can then use a mobile device (e.g., by way of a software application installed on the mobile device) or other device or service to track the tracking device and corresponding object. For example, the mobile device can perform a local search for a tracking device attached to a near-by object. However, in situations where the user is unable to locate the tracking device using their own mobile device (e.g., if the tracking device is beyond a distance within which the mobile device and the tracking device can communicate), the user can leverage the capabilities of a community of users of a tracking device system.

In particular, a tracking system (also referred to herein as a "cloud server" or simply "server") can maintain user profiles associated with a plurality of users of the tracking device system. The tracking system can associate each user within the system with one or more tracking devices associated the user (e.g., tracking devices that the user has purchased and is using to track objects owned by the user). If the user's object becomes lost or stolen, the user can send an indication that the tracking device is lost to the tracking system, which is in communication with one or more mobile devices associated with the community of users in communication with the system. The tracking system can set a flag indicating the tracking device is lost. When one of a community of mobile devices that are scanning for nearby tracking devices and providing updated locations to the tracking system identifies a flagged tracking device, the tracking system can associate the received location with the flagged tracking device, and relay the location to a user of the tracking device, thereby enabling the user to locate the lost tracking device.

Figure 1:
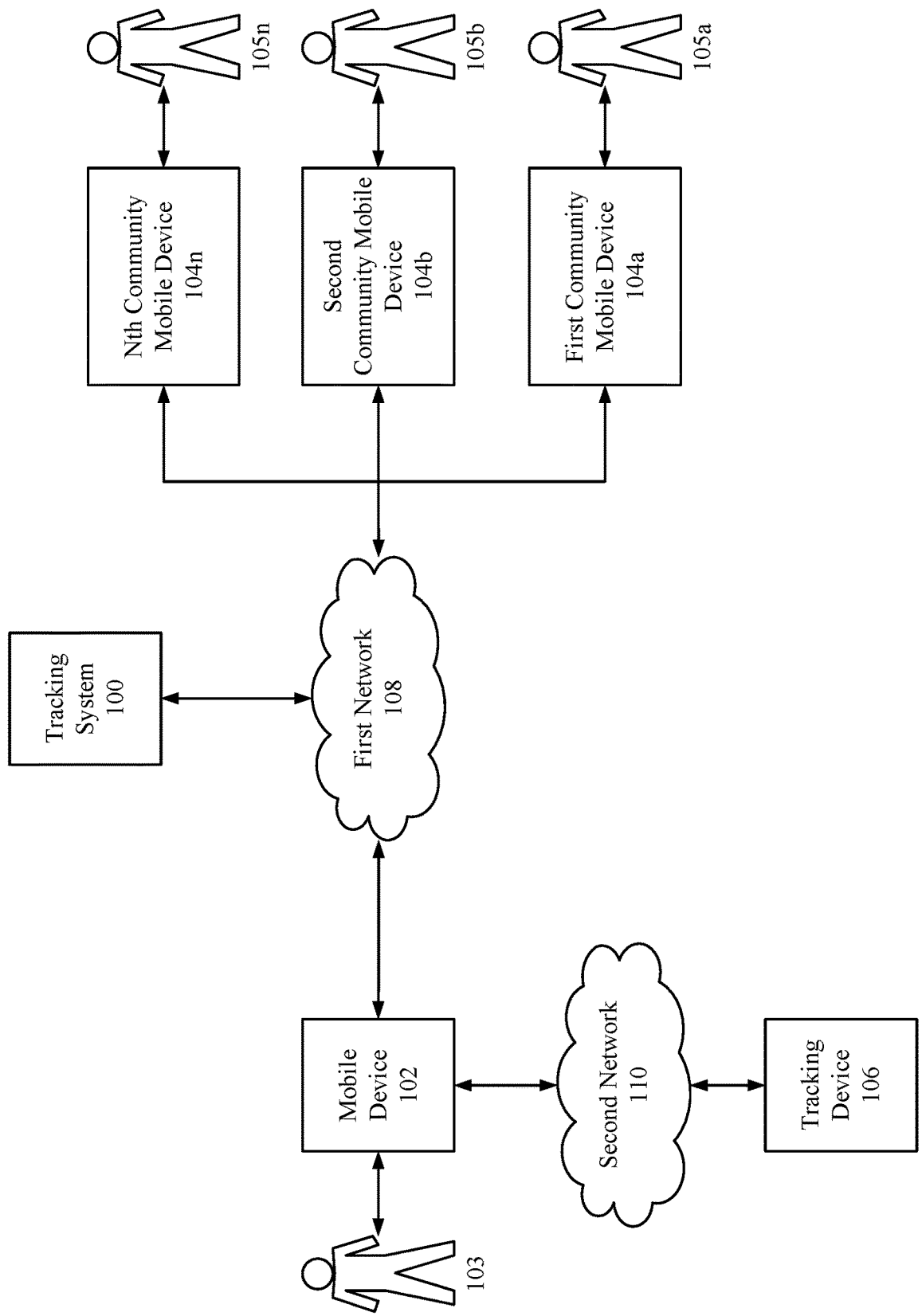
FIG. 1 illustrates an example tracking system environment in which a tracking device can operate, according to one embodiment.

FIG. 1 illustrates an example tracking system environment in which a tracking device can operate, according to one embodiment. The environment of FIG. 1 includes a tracking system 100 communicatively coupled to a mobile device 102 associated with the user 103 via a first network 108. The tracking system 100 is also communicatively coupled to a plurality of community mobile devices 104a through 104n (collectively referred to herein as "community mobile devices 104") associated with a plurality of users 105a through 105n of the tracking system 100 (collectively referred to herein as "community users 105") via the first network 108. As will be explained in more detail below, the tracking system 100 can allow the user 103 to manage and/or locate a tracking device 106 associated with the user 103. In some embodiments, the tracking system 100 leverages the capabilities of community mobile devices 104 to locate the tracking device 106 if the location of the tracking device is unknown to the user 103 and beyond the capabilities of mobile device 102 to track. In some configurations, the user 103 may own and register multiple tracking devices 106. Although FIG. 1 illustrates a particular arrangement of the tracking system 100, mobile device 102, community mobile devices 104, and tracking device 106, various additional arrangements are possible.

In some configurations, the user 103 may be part of the community of users 105. Further, one or more users 105 may own and register one or more tracking devices 106. Thus, any one of the users within the community of users 105 can communicate with tracking system 100 and leverage the capabilities of the community of users 105 in addition to the user 103 to locate a tracking device 106 that has been lost.

The tracking system 100, mobile device 102, and plurality of community mobile devices 104 may communicate using any communication platforms and technologies suitable for transporting data and/or communication signals, including known communication technologies, devices, media, and protocols supportive of remote data communications.

In certain embodiments, the tracking system 100, mobile device 102, and community mobile devices 104 may communicate via a network 108, which may include one or more networks, including, but not limited to, wireless networks (e.g., wireless communication networks), mobile telephone networks (e.g., cellular telephone networks), closed communication networks, open communication networks, satellite networks, navigation networks, broadband networks, narrowband networks, the Internet, local area networks, and any other networks capable of carrying data and/or communications signals between the tracking system 100, mobile device 102, and community mobile devices 104. The mobile device 102 and community of mobile devices 104 may also be in communication with a tracking device 106 via a second network 110. The second network 110 may be a similar or different type of network as the first network 108. In some embodiments, the second network 110 comprises a wireless network with a limited communication range, such as a Bluetooth or Bluetooth Low Energy (BLE) wireless network. In some configurations, the second network 110 is a point-to-point network including the tracking device 106 and one or more mobile devices that fall within a proximity of the tracking device 106. In such embodiments, the mobile device 102 and community mobile devices 104 may only be able to communicate with the tracking device 106 if they are within a close proximity to the tracking device, though in other embodiments, the tracking device can use long-distance communication functionality (for instance, a GSM transceiver) to communicate with either a mobile device 102/104 or the tracking system 100 at any distance. In some configurations, the mobile device 102 and one or more community mobile devices 104 may each be associated with multiple tracking devices associated with various users.

As mentioned above, FIG. 1 illustrates the mobile device 102 associated with the user 103. The mobile device 102 can be configured to perform one or more functions described herein with respect to locating tracking devices (e.g., tracking device 106). For example, the mobile device 102 can receive input from the user 103 representative of information about the user 103 and information about a tracking device 106. The mobile device 102 may then provide the received user information, tracking device information, and/or information about the mobile device 102 to the tracking system 100. Accordingly, the tracking system 100 is able to associate the mobile device 102, the user 103, and/or the tracking device 106 with one another. In some embodiments, the mobile device 102 can communicate with the tracking device 106 and provide information regarding the location of the tracking device to the user 103. For example, the mobile device 102 can detect a communication signal from the tracking device 106 (e.g., by way of second network 110) as well as a strength of the communication signal or other measure of proximity to determine an approximate distance between the mobile device 102 and the tracking device 106.

The mobile device 102 can then provide this information to the user 103 (e.g., by way of one or more graphical user interfaces) to assist the user 103 to locate the tracking device 106. Accordingly, the user 103 can use the mobile device 102 to track and locate the tracking device 106 and a corresponding object associated with the tracking device 106. If the mobile device 102 is located beyond the immediate range of communication with the tracking device 106 (e.g., beyond the second network 110), the mobile device 102 can be configured to send an indication that a tracking device 106 is lost to the tracking system 100, requesting assistance in finding the tracking device. The mobile device 102 can send an indication of a lost device in response to a command from the user 103. For example, once the user 103 has determined that the tracking device 106 is lost, the user can provide user input to the mobile device 102 (e.g., by way of a graphical user interface), requesting that the mobile device 102 send an indication that the tracking device 106 is lost to the tracking system 100. In some examples, the lost indication can include information identifying the user 103 (e.g., name, username, authentication information), information associated with the mobile device 102 (e.g., a mobile phone number), information associated with the tracking device (e.g., a unique tracking device identifier), or a location of the user (e.g., a GPS location of the mobile device 102 at the time the request is sent).

The tracking system 100 can be configured to provide a number of features and services associated with the tracking and management of a plurality of tracking devices and/or users associated with the tracking devices. For example, the tracking system 100 can manage information and/or user profiles associated with user 103 and community users 105. In particular, the tracking system 100 can manage information associated with the tracking device 106 and/or other tracking devices associated with the user 103 and/or the community users 105.

As mentioned above, the tracking system 100 can receive an indication that the tracking device 106 is lost from the mobile device 102. The tracking system 100 can then process the indication in order to help the user 103 find the tracking device 106. For example, the tracking system 100 can leverage the capabilities of the community mobile devices 104 to help find the tracking device 106. In particular, the tracking system 100 may set a flag for a tracking device 106 to indicate that the tracking device 106 lost and monitor communications received from the community mobile devices 104 indicating the location of one or more tracking devices 106 within proximity of the community mobile devices 104. The tracking system 100 can determine whether a specific location is associated with the lost tracking device 106 and provide any location updates associated with the tracking device 106 to the mobile device 102. In one example, the tracking system may receive constant updates of tracking device 106 locations regardless of whether a tracking device 106 is lost and provide a most recent updated location of the tracking device 106 in response to receiving an indication that the tracking device 106 is lost.

In some configurations, the tracking system 100 can send a location request associated with the tracking device 106 to each of the community mobile devices 104. The location request can include any instructions and/or information necessary for the community mobile devices 106 to find the tracking device 102. For example, the location request can include a unique identifier associated with the tracking device 106 that can be used by the community mobile devices 104 to identify the tracking device 106. Accordingly, if one of the community mobile devices 104 detects a communication from the tracking device 106 (e.g., if the community mobile device 104 is within range or moves within range of the communication capabilities of the tracking device 106 and receives a signal from the tracking device 106 including or associated with the unique identifier associated with the tracking device 106), the community mobile device 104 can inform the tracking system 100. Using the information received from the community mobile devices 104, the tracking system 100 can inform the user (e.g., by way of the mobile device 102) of a potential location of the tracking device 106.

As shown in FIG. 1 and as mentioned above, the tracking system 100 can communicate with a plurality of community mobile devices 104 associated with corresponding community users 105. For example, an implementation may include a first community mobile device 104a associated with a first community user 105a, a second community mobile device 104b associated with a second community user 105b, and additional communication mobile devices associated with additional community users up to an nth community mobile device 104n associated with an nth community user 105n. The community mobile devices 104 may also include functionality that enables each community mobile device 104 to identify a tracking device 106 within a proximity of the community mobile device 104. In one example, a first community mobile device 104a within proximity of a tracking device 106 can communicate with the tracking device 106, identify the tracking device 106 (e.g., using a unique identifier associated with the tracking device 106), and/or detect a location associated with the tracking device 106 (e.g., a location of the first mobile community device 104a at the time of the communication with the tracking device 106). This information can be used to provide updated locations and/or respond to a location request from the tracking system 100 regarding the tracking device 106. In some embodiments, the steps performed by the first community mobile device 104a can be hidden from the first community user 105a. Accordingly, the first community mobile device 104a can assist in locating the tracking device 106 without bother and without the knowledge of the first community user 105a.

As mentioned above, the tracking system 100 can assist a user 103 in locating a tracking device 106. The tracking device may be a chip, tile, tag, or other device for housing circuitry and that may be attached to or enclosed within an object such as a wallet, keys, purse, car, or other object that the user 103 may track. Additionally, the tracking device 106 may include a speaker for emitting a sound and/or a transmitter for broadcasting a beacon. In one configuration, the tracking device 106 may periodically transmit a beacon signal that may be detected using a nearby mobile device 102 and/or community mobile device 104. In some configurations, the tracking device 106 broadcasts a beacon at regular intervals (e.g., one second intervals) that may be detected from a nearby mobile device (e.g., community mobile device 104). The strength of the signal emitted from the tracking device 106 may be used to determine a degree of proximity to the mobile device 102 or community mobile device 104 that detects the signal. For example, a higher strength signal would indicate a close proximity between the tracking device 106 and the mobile device 102 and a lower strength signal would indicate a more remote proximity between the tracking device 106 and the mobile device 102, though in some embodiments, the tracking device 106 can intentionally vary the transmission strength of the beacon signal. In some cases, the strength of signal or absence of a signal may be used to indicate that a tracking device 106 is lost.

System Overview

Figure 2:
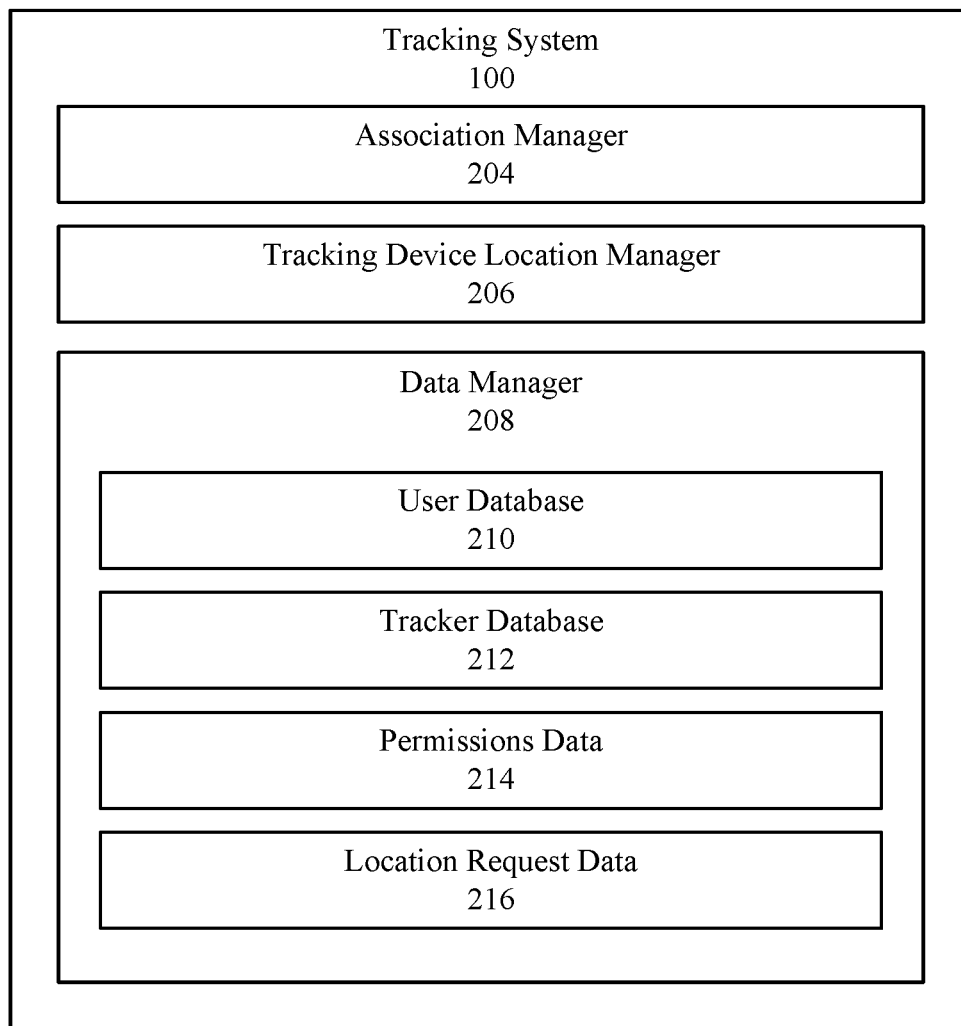
FIG. 2 illustrates an example tracking system for use in a tracking system environment, according to one embodiment.

FIG. 2 illustrates an example tracking system for use in a tracking system environment, according to one embodiment. As shown, the tracking system 100 may include, but is not limited to, an association manager 204, a tracking device location manager 206, and a data manager 208, each of which may be in communication with one another using any suitable communication technologies. It will be recognized that although managers 204-208 are shown to be separate in FIG. 2, any of the managers 204-208 may be combined into fewer managers, such as into a single manager, or divided into more managers as may serve a particular embodiment.

The association manager 204 may be configured to receive, transmit, obtain, and/or update information about a user 103 and/or information about one or more specific tracking devices (e.g., tracking device 106). In some configurations, the association manager 204 may associate information associated with a user 103 with information associated with a tracking device 106. For example, user information and tracking information may be obtained by way of a mobile device 102, and the association manager 204 may be used to link the user information and tracking information. The association between user 103 and tracking device 106 may be used for authentication purposes, or for storing user information, tracking device information, permissions, or other information about a user 103 and/or tracking device 106 in a database.

The tracking system 100 also includes a tracking device location manager 206. The tracking device location manager 206 may receive and process an indication that the tracking device 106 is lost from a mobile device (e.g., mobile device 102 or community mobile devices 104). For example, the tracking system 100 may receive a lost indication from a mobile device 102 indicating that the tracking device 106 is lost. The tracking device location manager 206 may set a flag on a database (e.g., tracker database 212) indicating that the tracking device 106 is lost. The tracking device location manager 206 may also query a database to determine tracking information corresponding to the associated user 103 and/or tracking device 106. The tracking system 100 may obtain tracking device information and provide the tracking device information or other information associated with the tracking device 106 to a plurality of community mobile devices 104 to be on alert for the lost or unavailable tracking device 106.

The tracking device location manager 206 may also receive a location from one or more community mobile devices 104 that detect the tracking device 106, for instance in response to the community mobile device receiving a beacon signal transmitted by the tracking device 106, without the tracking device 106 having been previously marked as lost. In such embodiments, a user corresponding to the mobile device 102 can request a most recent location associated with the tracking device from the tracking system 100, and the location manager 206 can provide the location received from the community mobile device for display by the mobile device 102. In some embodiments, the location manager 206 provides the location of the tracking device 106 received from a community mobile device either automatically (for instance if the tracking device 106 is marked as lost) or at the request of a user of the mobile device 102 (for instance, via an application on the mobile device 102). The location manager 206 can provide a location of a tracking device 106 to a mobile device 102 via a text message, push notification, application notification, automated voice message, or any other suitable form of communication.

The tracking device location manager 206 may further manage providing indications about whether a tracking device 106 is lost or not lost. For example, as discussed above, the tracking device location manager 206 may provide a location request to the community of mobile devices 104 indicating that a tracking device 106 is lost. Additionally, upon location of the tracking device 106 by the user 103 or by one of the community of users 105, the tracking device location manager 206 may provide an indication to the user 103, community user 105, or tracking system 100 that the tracking device 106 has been found, thus removing any flags associated with a tracking device and/or canceling any location request previously provided to the community of users 105. For example, where a user 103 sends an indication that the tracking device 106 is lost to the tracking system 100 and later finds the tracking device 106, the mobile device 102 may provide an indication to the tracking system 100 that the tracking device 106 has been found. In response, the tracking device location manager 206 may remove a flag indicating that the tracking device 106 is lost and/or provide an updated indication to the community of users 105 that the tracking device 106 has been found, thus canceling any instructions associated with the previously provided location request. In some configurations, the notification that the tracking device 106 has been found may be provided automatically upon the mobile device 102 detecting the tracking device 106 within a proximity of the mobile device 102. Alternatively, the notification that the tracking device 106 has been found may be provided by the user 103 via user input on the mobile device 102. In another example, a known user (e.g., a friend or family member) with whom the tracking device 106 has been shared may provide an indication that the tracking device 106 has been found.

The tracking system 100 additionally includes a data manager 208. The data manager 208 may store and manage information associated with users, mobile devices, tracking devices, permissions, location requests, and other data that may be stored and/or maintained in a database related to performing location services of tracking devices. As shown, the data manager 208 may include, but is not limited to, a user database 210, a tracker database 212, permissions data 214, and location request data 216. It will be recognized that although databases and data within the data manager 208 are shown to be separate in FIG. 2, any of the user database 210, tracker database 212, permissions data 214, and location request data 216 may be combined in a single database or manager, or divided into more databases or managers as may serve a particular embodiment.

The data manager 208 may include the user database 210. The user database 210 may be used to store data related to various users. For example, the user database 210 may include data about the user 103 as well as data about each user 105 in a community of users 105. The community of users 105 may include any user that has provided user information to the tracking system 100 via a mobile device 102, 104 or other electronic device. The user information may be associated with one or more respective tracking devices 106, or may be stored without an association to a particular tracking device. For example, a community user 105 may provide user information and permit performance of tracking functions on the community mobile device 104 without owning or being associated with a tracking device 106. The user database 210 may also include information about one or more mobile devices or other electronic devices associated with a particular user.

The data manager 208 may also include a tracker database 212. The tracker database 212 may be used to store data related to tracking devices. For example, the tracker database 212 may include tracking data for any tracking device 106 that has been registered with the tracking system 100. Tracking data may include unique tracker identifications (IDs) associated with individual tracking devices 106. Tracker IDs may be associated with a respective user 103. Tracker IDs may also be associated with multiple users. Additionally, the tracker database 212 may include any flags or other indications associated with whether a specific tracking device 106 has been indicated as lost and whether any incoming communications with regard to that tracking device 106 should be processed based on the presence of a flag associated with the tracking device 106.

The data manager 208 may further include permissions data 214 and location request data 216. Permissions data 214 may include levels of permissions associated with a particular user 103 and/or tracking device 106. For example, permissions data 214 may include additional users that have been indicated as sharing a tracking device 106, or who have been given permission to locate or receive a location of a tracking device 106. Location request data 216 may include information related to a location request or a lost indication received from the user 103 via a mobile device 102.

Figure 3:
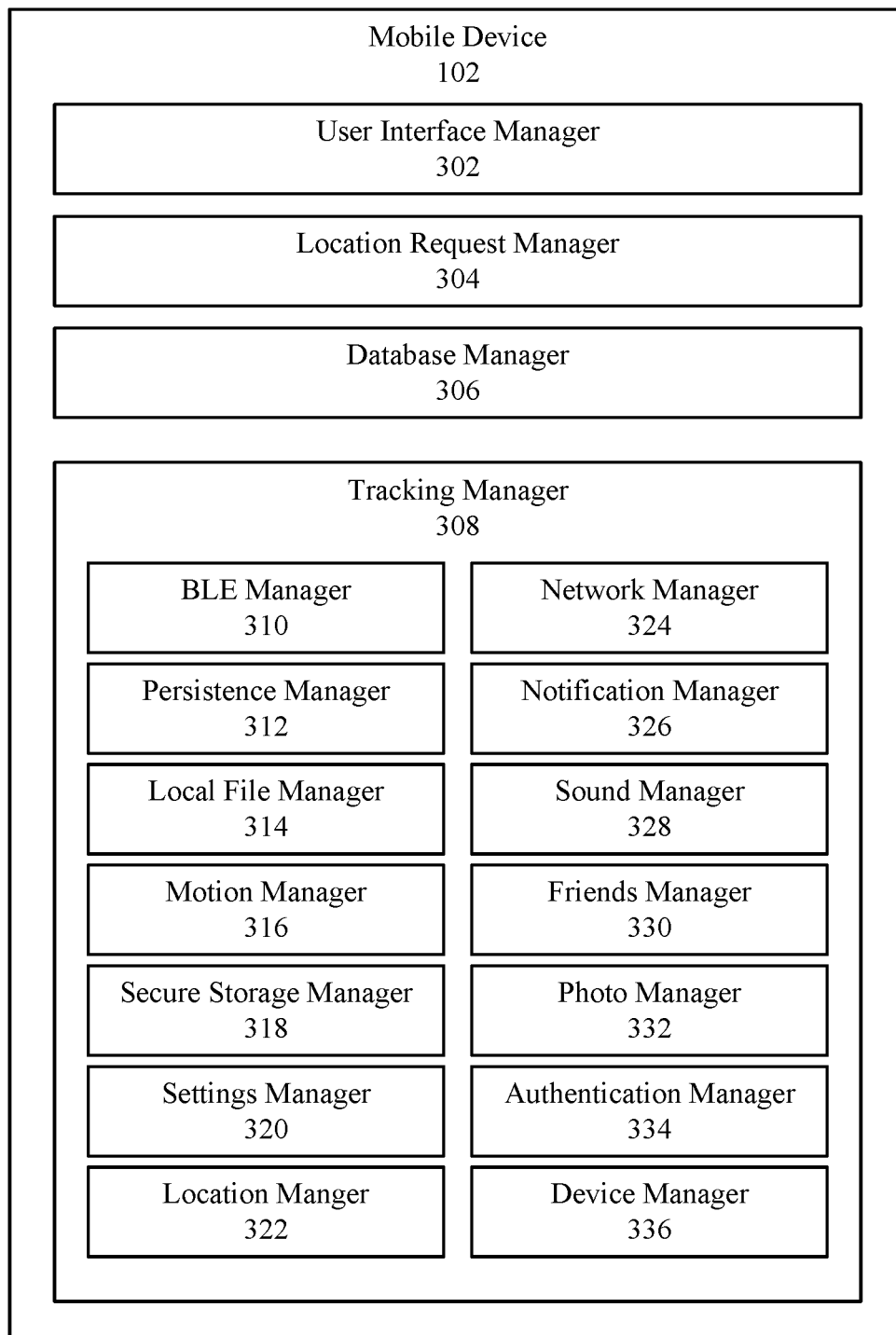
FIG. 3 illustrates an example user mobile device for use in a tracking system environment, according to one embodiment.

FIG. 3 illustrates an example user mobile device for use in a tracking system environment, according to one embodiment. As shown, the mobile device 102 may include, but is not limited to, a user interface manager 302, a location request manager 304, a database manager 306, and a tracking manager 308, each of which may be in communication with one another using any suitable communication technologies. It will be recognized that although managers 302-308 are shown to be separate in FIG. 3, any of the managers 302-308 may be combined into fewer managers, such as into a single manager, or divided into more managers as may serve a particular embodiment.

As will be explained in more detail below, the mobile device 102 includes the user interface manager 302. The user interface manager 302 may facilitate providing the user 103 access to data on a tracking system 100 and/or providing data to the tracking system 100. Further, the user interface manager 302 provides a user interface by which the user 103 may communicate with tracking system 100 and/or tracking device 106 via mobile device 102.

The mobile device 102 may also include a location request manager 304. The location request manager 304 may receive and process a request input to the mobile device 102 to send an indication that a tracking device 106 is lost to a tracking system 100. For example, the user 103 may provide an indication that a tracking device 106 is lost, unreachable, or otherwise unavailable from the mobile device 102 via the user interface manager 302, and the location request manager 304 may process the lost indication and provide any necessary data to the tracking system 100 for processing and relaying a location request to other users 105 over a network 108. In some configurations, an indication that a tracking device 106 is lost is provided via user input. Alternatively, the indication may be transmitted automatically in response to the mobile device 102 determining that a tracking device 106 is lost.

In addition, the location request manager 304 can request a location of the tracking device 106 without the tracking device 106 being identified as lost. For instance, a user can access a tracking device location feature of an application running on the mobile device 102 (for example, via the user interface manager 302), and the location request manager 304 can request a most recent location of the tracking device 106 from the tracking system 100. The location request manager 304 can receive the most recent location from the tracking system 100, and can display the most recent location via the user interface manager 302.

The mobile device 102 may also include a database manager 306. The database manager 306 may maintain data related to the user 103, tracking device 106, permissions, or other data that may be used for locating a tracking device 106 and/or providing a request to a tracking system 100 for locating one or more tracking devices 106 associated with the user 103. Further, the database manager 306 may maintain any information that may be accessed using any other manager on the mobile device 102.

The mobile device 102 may further include a tracking manager 308. The tracking manager 308 may include a tracking application (e.g., a software application) for communicating with and locating a tracking device 106 associated with the user 103. For example, the tracking manager 308 may be one configuration of a tracking application installed on the mobile device 102 that provides the functionality for locating a tracking device 106 and/or requesting location of a tracking device 106 using a tracking system 100 and/or a plurality of community mobile devices 104. As shown, the tracking manager 308 may include, but is not limited to, a Bluetooth Low Energy (BLE) manager 310, a persistence manager 312, a local files manager 314, a motion manager 316, a secure storage manager 318, a settings manager 320, a location manager 322, a network manager 324, a notification manager 326, a sound manager 328, a friends manager 330, a photo manager 332, an authentication manager 334, and a device manager 336. Thus, the tracking manager 308 may perform any of the functions associated with managers 310-338, described in additional detail below.

The BLE manager 310 may be used to manage communication with one or more tracking devices 106. The persistence manager 312 may be used to store logical schema information that is relevant to the tracking manager 308. The local files manager 314 may be responsible for managing all files that are input or output from the mobile device 102. The motion manager 316 may be responsible for all motion management required by the tracking manager 308. The secure storage manager may be responsible for storage of secure data, including information such as passwords and private data that would be accessed through this sub-system. The settings manager 320 may be responsible for managing settings used by the tracking manager 308. Such settings may be user controlled (e.g., user settings) or defined by the tracking manager 308 for internal use (e.g., application settings) by a mobile device 102 and/or the tracking system 100. The location manager 322 may be responsible for all location tracking done by the tracking manager 308. For example, the location manager 322 may manage access to the location services of the mobile device 102 and works in conjunction with other managers to persist data. The network manager 324 may be responsible for all Internet communications from the tracking manager 308. For example, the network manager 324 may mediate all Internet API calls for the tracking manager 308. The notification manager 326 may be responsible for managing local and push notifications required by the tracking manager 308. The sound manager 328 may be responsible for playback of audio cues by the tracking manager 308. The friends manager 330 may be responsible for managing access to contacts and the user's social graph. The photo manager 332 may be responsible for capturing and managing photos used by the tracking manager 308. The authentication manager 334 may be responsible for handling the authentication (e.g., sign in or login) of users. The authentication manager 334 may also include registration (e.g., sign up) functionality. The authentication manager 334 further coordinates with other managers to achieve registration functionality. The device manager 336 may be responsible for managing the devices discovered by the tracking manager 308. The device manager 336 may further store and/or maintain the logic for algorithms related to device discovery and update.

Figure 4:
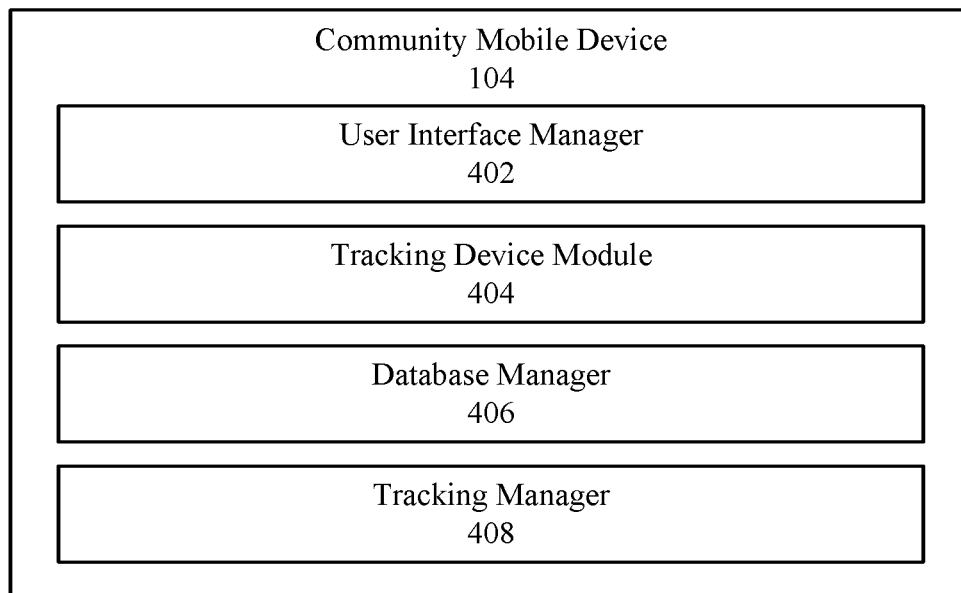
FIG. 4 illustrates an example community mobile device for use in a tracking system environment, according to one embodiment.

FIG. 4 illustrates an example community mobile device for use in a tracking system environment, according to one embodiment. As shown, the community mobile device 104 may include, but is not limited to, a user interface manager 402, a tracking device manager 404, a database manager 406, and a tracking manager 408, each of which may be in communication with one another using any suitable communication technologies. The user interface manager 402, database manager 406, and tracking manager 408 illustrated in FIG. 4 may include similar features and functionality as the user interface manager 302, database manager 306, and tracking manager 308 described above in connection with FIG. 3. It will be recognized that although managers 402-408 are shown to be separate in FIG. 4, any of the managers 402-408 may be combined into fewer managers, such as into a single manager, or divided into more managers as may serve a particular embodiment.

The community mobile device 104 may include a tracking device manager 404. The tracking device manager 404 may facilitate scanning for nearby tracking devices 106. In some configurations, the tracking device manager 404 can continuously or periodically scan (e.g., once per second) for nearby tracking devices 106. The tracking device manager 404 may determine whether to provide an updated location of the nearby tracking device 106 to the tracking system 100. In some configurations, the tracking device manager 404 provides a location of a nearby tracking device 106 automatically. Alternatively, the tracking device manager 404 may determine whether the location of the tracking device 106 has been recently updated, and may determine whether to provide an updated location based on the last time a location of the tracking device 106 has been updated (e.g., by the community mobile device 104). For example, where the community mobile device 104 has provided a recent update of the location of a tracking device 106, the tracking device manager 404 may decide to wait a predetermined period of time (e.g., 5 minutes) before providing an updated location of the same tracking device 106.

In one configuration, the tracking device manager 404 may receive and process a location request or other information relayed to the community mobile device 104 by the tracking system 100. For example, the tracking device manager 404 may receive an indication of a tracking device 106 that has been indicated as lost, and provide a location of the tracking device 106 if it comes within proximity of the community mobile device 104. In some configurations, the community mobile device 104 is constantly scanning nearby areas to determine if there is a tracking device 106 within a proximity of the community mobile device 104. Therefore, where a tracking device 106 that matches information provided by the tracking system 100 (e.g., from the location request) comes within proximity of the community mobile device 104, the tracking device manager 404 may generate and transmit a response to the location request to the tracking system 100, which may be provided to the user 103 associated with the tracking device 106. Further, generating and transmitting the response to the tracking request may be conditioned on the status of the tracking device 106 being flagged as lost by the mobile device 102 and/or the tracking system 100.

The tracking device manager 404 may additionally provide other information to the tracking system 100 in response to receiving the tracking request. For example, in addition to providing a location of the community mobile device 104, the tracking device manager may provide a signal strength associated with the location to indicate a level of proximity to the location of the community mobile device 104 provided to the user 103. For example, if a signal strength is high, the location provided to the user 103 is likely to be more accurate than a location accompanied by a low signal strength. This may provide additional information that the user 103 may find useful in determining the precise location of tracking device 106.

As described above, the tracking device manager 404 may determine whether to send a location within the proximity of the tracking device 106 to the tracking system 100. The determination of whether to send a location to the tracking system 100 may be based on a variety of factors. For example, a tracking device manager 404 may determine to send a location of the tracking device 106 to a tracking system 100 based on whether the detected tracking device 106 has been indicated as lost or if a tracking request has been provided to the community mobile device 104 for the particular tracking device 106. In some configurations, the community mobile device 104 may send an update of a location of a tracking device 106 even if the tracking device 106 is not associated with a current tracking request or if the tracking device 106 is not indicated as lost. For example, where the location of a tracking device 106 has not been updated for a predetermined period of time, the community mobile device 104 may provide an update of a tracking device location to the tracking system 100, regardless of whether a tracking request has been received.

In some configurations, the community mobile device 104 may include additional features. For example, the community mobile device 104 may allow a tracking system 100 to snap and download a photo using photo functionality of the community mobile device 104. In some configurations, this may be an opt-in feature by which a community user 105 permits a tracking system 100 to take a snap-shot and possibly provide a visual image of an area within a proximity of the tracking device 106.

Figure 5:
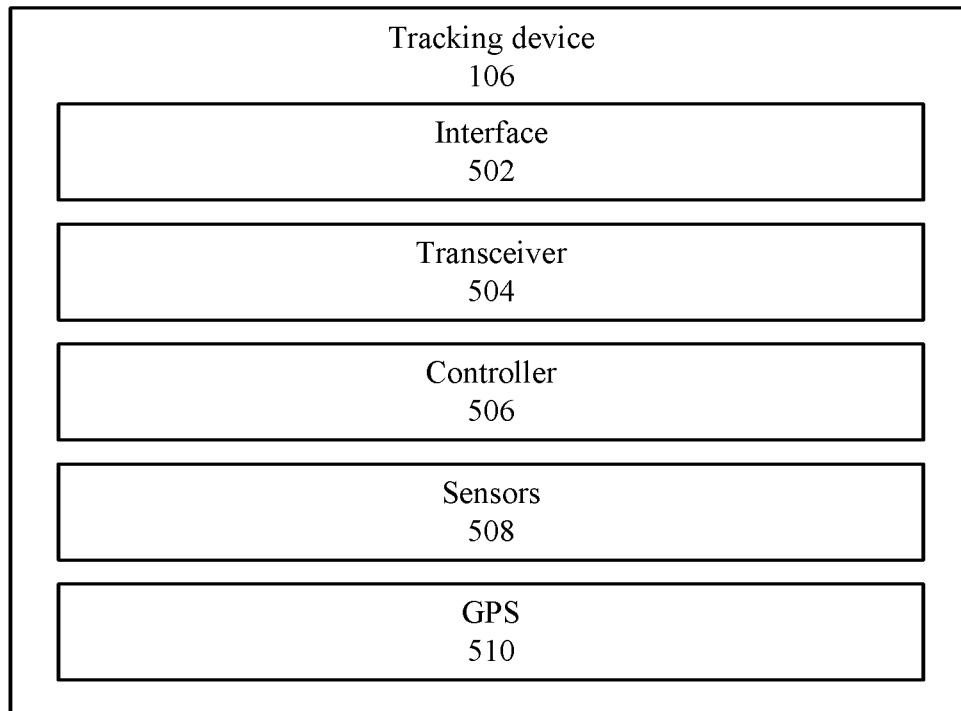
FIG. 5 illustrates an example tracking device for use in a tracking system environment, according to one embodiment.

FIG. 5 illustrates an example tracking device for use in a tracking system environment, according to one embodiment. The tracking device 106 of FIG. 5 includes an interface 502, a transceiver 504, a controller 506, one or more sensors 508, and a GPS unit 510. The transceiver 504 is a hardware circuit capable of both transmitting and receiving signals. It should be noted that in other embodiments, the tracking device 106 includes fewer, additional, or different components than those illustrated in FIG. 5.

The interface 502 provides a communicative interface between the tracking device 106 and one or more other devices, such as a mobile device 102. For instance, the interface 502 can instruct the transceiver 504 to output beacon signals as described above (for example, periodically or in response to a triggering event, such as a detected movement of the tracking device 106). The interface 502 can, in response to the receiving of signals by the transceiver 504 from, for instance, the mobile device 102, manage a pairing protocol to establish a communicative connection between the tracking device 106 and the mobile device 102.

As noted above, the pairing protocol can be a BLE connection, though in other embodiments, the interface 502 can manage other suitable wireless connection protocols (such as WiFi, Global System for Mobile Communcations or GSM, and the like).

The controller 506 is a hardware chip that configures the tracking device 106 to perform one or more functions or to operate in one or operating modes or states. For instance, the controller 506 can configure the interval at which the transceiver broadcasts beacon signals, can authorize or prevent particular devices from pairing with the tracking device 106 based on information received from the devices and permissions stored at the tracking device, can increase or decrease the transmission strength of signals broadcasted by the transceiver, can configure the interface to emit a ringtone or flash an LED light, can enable or disable various tracking device sensors, can enable or disable a tracking device GPS unit, can enable or disable communicative functionality of the tracking device 106 (such as a GSM transmitter and receiving), can configure the tracking device into a sleep mode or awake mode, can configure the tracking device into a power saving mode, and the like. The controller 506 can configure the tracking device to perform functions or to operate in a particular operating mode based on information or signals received from a device paired with or attempting to pair with the tracking device 106, based on an operating state or connection state of the tracking device 106, based on user-selected settings, based on information stored at the tracking device 106, based on a detected location of the tracking device 106, based on historical behavior of the tracking device 106 (such as a previous length of time the tracking device was configured to operate in a particular mode), based on information received from the sensors 508 or the GPS 510, or based on any other suitable criteria.

The sensors 508 can include motion sensors (such as gyroscopes or accelerators), altimeters, orientation sensors, proximity sensors, light sensors, or any other suitable sensor configured to detect an environment of the tracking device 106, a state of the tracking device 106, a movement or location of the tracking device 106, and the like. The sensors 508 are configured to provide information detected by the sensors to the controller 506. The GPS unit 510 is configured to detect a location of the tracking device 106 based on received GPS signals, and is configured to provide detected locations to the controller 506.

Tracking Device-Enabled Task Completion Tracking

In some embodiments, the tracking system 100 can track or identify the completion of tasks by a user 103 based on a physical proximity between the tracking device 106 and one or more objects corresponding to the tasks. As used herein, "completion of a task" can refer to the presence of the user 103 at a particular location, the performance of an action by the user, the movement of a user from a first location to a second location, or the like. As used herein, an "object corresponding to a task" refers to a device configured to wirelessly detect the tracking device 106 and communicate the detection of the tracking device with the tracking system 100. As used herein, "based on physical proximity between the tracking device and an object" refers to the wireless receipt by the object of a signal from the tracking device, for instance when the tracking device is located within the communicative range of the object or vice versa.

In some embodiments, the tracking system 100 can implement a game or scavenger hunt including a plurality of objects configured to detect the tracking device 106 and provide an indication to the tracking system when the tracking device is detected. For example, a set of objects can be dispersed within a geographic area, and a set of users (each associated with a different tracking device) can "hunt" for the objects by moving within the geographic area. As the tracking device of a user moves within a threshold distance of each object, the object can inform the tracking system 100 that the user "found" the object. The tracking system 100 can, for each of the plurality of users, keep track of which objects have been found by the user. The tracking system 100 can inform each user of the objects that they've found, can illustrate within a map interface of a mobile device of the user the locations within the geographic region that the user has traveled (for instance using a GPS capability of the mobile device), and can provide rewards or notifications to one or more users that find all or a threshold number of the objects within the geographic area.

In some embodiments, users are unaware of the location of objects within a geographic area, and must "find" the objects by moving around the geographic area. In other embodiments, the tracking system 100 can provide the locations of the objects to the mobile device of the user, and the mobile device can illustrate the locations of the objects within a map interface displayed by the mobile device. In some embodiments, the tracking system 100 can also include an order that a tracking device must find objects—in such embodiments, the tracking system will consider an object detected only in response to the tracking device being within a threshold proximity of the object and the object being the next object in the provided order. Accordingly, if the tracking device moves within a threshold proximity of an object out of order (e.g., if the tracking devices moves within a threshold proximity of a second object in an order before a first object in an order), the object can provide an indication that the object detected the tracking device to the tracking system, but the tracking system won't indicate that the user associated with the tracking device has found the object until the objects before the object in the order have been found (and may require the user to re-find the object after).

In some embodiments, when a user moves within a threshold distance of an object associated with a task (or, likewise, when a user finds all or a required threshold of objects associated with tasks), the mobile device or the tracking device of the user can emit a notification, such as an audio sound, a vibration, a displayed notification (such as a lit LED or a graphical notification on a display), and the like. In some embodiments, the mobile device or tracking of the user emits such notifications in response to a notification from the tracking system 100 that one or more objects detected the tracking device, while in other embodiments, the mobile device or the tracking device emits notifications in response to the tracking device detecting the object.

In some embodiments, tracking the completion of a task by the tracking system 100 requires the satisfaction of a combination of criteria. For instance, completing a task can require both the detection of a tracking device by an object, and the substantially concurrent performance of an action by a user. For example, each object can require a user to watch a corresponding video on the mobile device of the user, to take a quiz or enter an input on the mobile device, or to interact with the object while the user is within a threshold proximity of the object. In such embodiments, the tracking system 100 can include an order of tasks (such as job training tasks, educational tasks, or entertainment tasks) each associated with a different object in a different location, enabling an entity associated with the tracking system to coordinate the completion of tasks by users. In such embodiments, the tracking system can identify the tasks that must be performed and the locations in which they must be performed to the mobile device of the user, and the mobile device can display the tasks and locations to the user, enabling the user to identify a next task that must be performed, to view previously performed tasks, and to view when all tasks have been completed.

In some embodiments, instead of objects located within a geographic area, a set of tracking devices can be located within a geographic area, and a user can find each tracking device by moving within a threshold proximity of the tracking device such that a mobile device of the user receives a signal from the tracking device. The mobile device of the user can notify the tracking system that the mobile device detected the tracking device, and the tracking system can track that the user found the tracking device. In such embodiments, the tracking device can provide an identifier that uniquely identifies the tracking device or a secret code to the mobile device. The mobile device in turn can provide the unique identifier or the secret code to the tracking system. The tracking system, in response to receiving the unique identifier or secret code from the mobile device, can classify the tracking device as found by the user of the mobile device.

Figure 6:
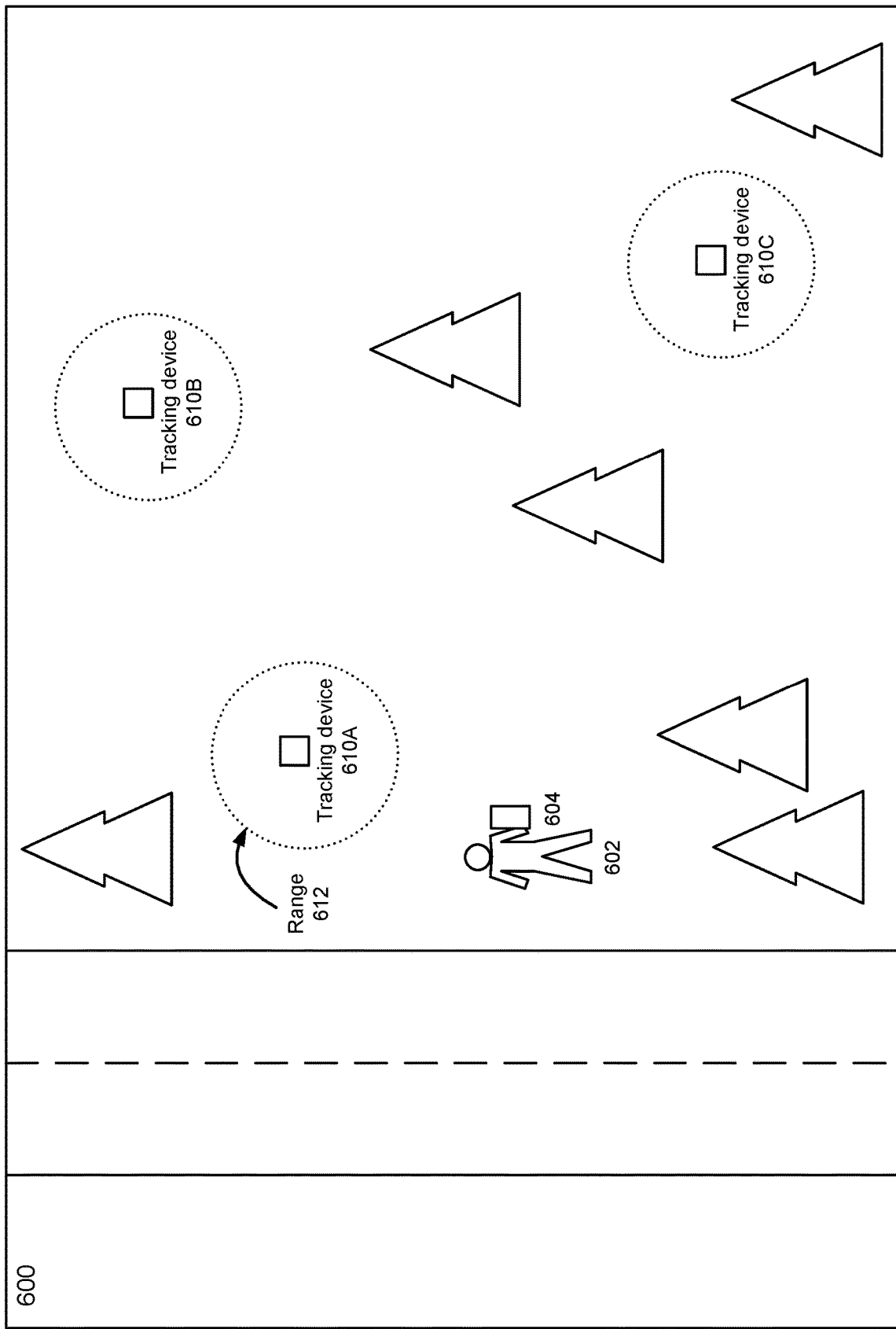
FIG. 6 illustrates an example scavenger hunt implemented in a tracking system environment, according to one embodiment.

FIG. 6 illustrates an example scavenger hunt implemented in a tracking system environment, according to one embodiment. In the embodiment of FIG. 6, a scavenger hunt is organized within a geographic area 600. A user 602 participating in the scavenger hunt will bring a mobile device 604 and will traverse the area 600. The mobile device 604 can display a tracking device interface associated with the scavenger hunt. Within the tracking device interface, a representation of each tracking device associated with the scavenger hunt will be displayed. For instance, the tracking device interface can include an icon for each tracking device associated with the scavenger hunt, text describing or identifying each tracking device in the scavenger hunt (or a task that must be completed corresponding to each tracking device), an indication of a time range during which each tracking device must be found, a checklist with an entry for each tracking device in the scavenger hunt (such that each checklist entry is checked off after the corresponding tracking device is found), and the like. The tracking device interface can further display an approximate location of each tracking device (for instance, within a map interface), and a direction or heading associated with each tracking device or the closest tracking device relative to the user.

Three tracking devices 610A, 610B, and 610C are included within the scavenger hunt of the embodiment of FIG. 6. Each tracking device 610 is associated with a corresponding range 612 indicated within FIG. 6, and representative of the communicative range of the tracking device. As noted above, each tracking device 610 transmits periodic signals or communications that include an identity of the tracking device. When the mobile device 604 moves within the range 612 of a tracking device, such as tracking device 610A, the mobile device can receive a signal from the tracking device 610A. The mobile device 604 then determines a location of the mobile device using, for instance, a GPS receiver or other location-detection functionality, and provides the location of the mobile device and the identity of the tracking device 610A to a central tracking system 100.

In some embodiments, in response to the tracking device 610A being included within the scavenger hunt, the central tracking system 100 can provide an instruction to the mobile device 604 or can otherwise cause the mobile device to modify the representation of the tracking device 610A displayed within the tracking device interface of the mobile device to indicate that the tracking device 610A has been found. In some embodiments, the mobile device 604 can determine that the tracking device 610A is included within the scavenger hunt independently of or without communicating with the central tracking device 100, and can modify the tracking device interface to indicate that the tracking device 610A has been found in response to receiving a communication from the tracking device 610A.

The user 602 can continue to move around the area 600 until the mobile device 604 receives a communication from each of the tracking devices 610. Upon receiving a communication from each successive tracking device 610, the tracking device interface of the mobile device 604 is modified to indicate that each new tracking device has been found. When all of the tracking devices 610 have been found, the tracking device interface can be modified (for instance, in response to an instruction from the central tracking system 100 or in response to the mobile device 604 determining that each tracking device 610 has been found) to indicate that each tracking device has been found, or that the scavenger hunt has been completed. In some embodiments, the tracking device interface can indicate a position or rank among a group of users that the user 602 completed the scavenger hunt. For instance, if the user 602 was the third user of a group of users to complete the scavenger hunt, the mobile device 604 can display the text "Congratulations, you've placed third in the scavenger hunt!"

Figure 7:
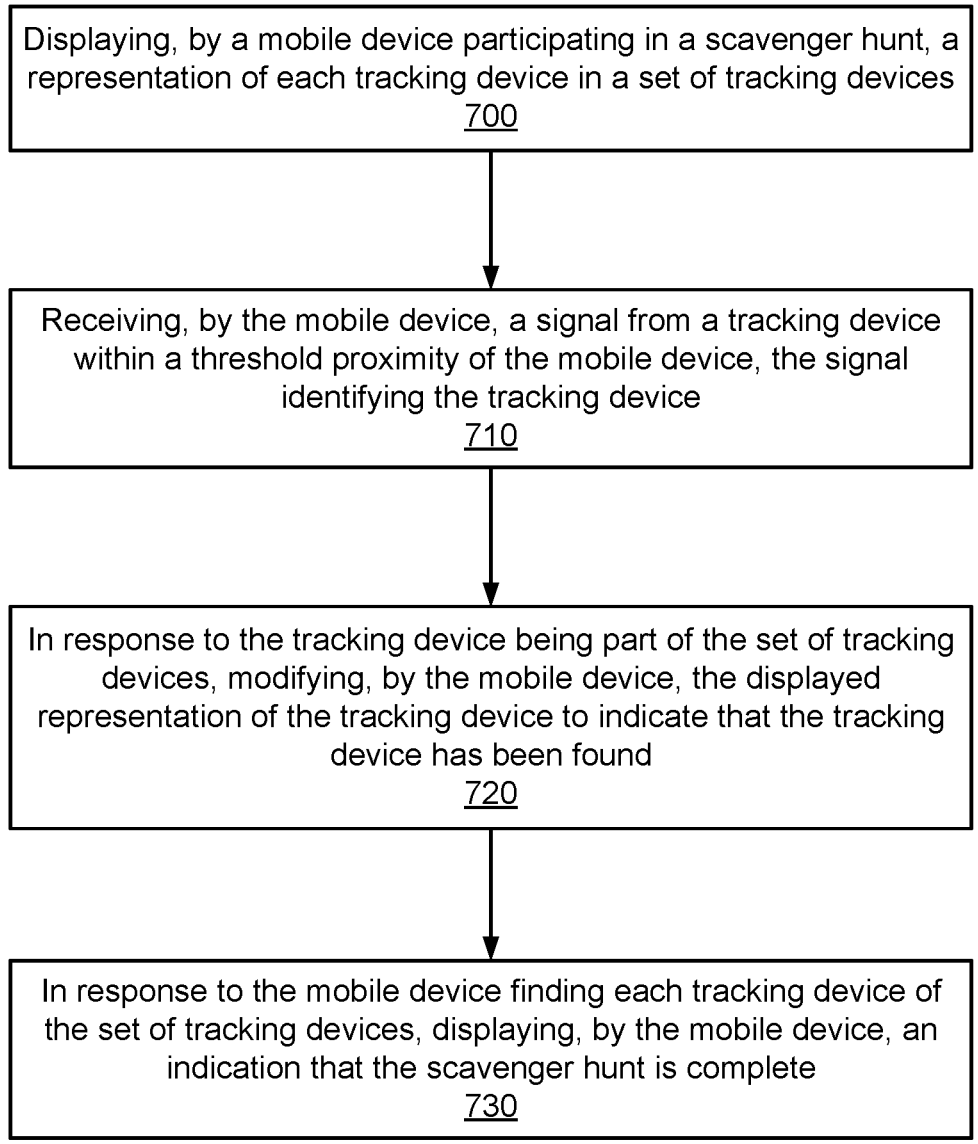
FIG. 7 is a flow chart illustrating a process for locating tracking devices within a scavenger hunt, according to one embodiment.

FIG. 7 is a flow chart illustrating a process for locating tracking devices within a scavenger hunt, according to one embodiment. A mobile device displays 700 a representation of each tracking device in a set of tracking devices of a scavenger hunt. The identities of each tracking device in the set of tracking devices can be provided to the mobile device, for instance from a central tracking system or from another device. In some embodiments, the locations of each tracking device can also be provided to the mobile device, and the mobile device can display the locations (or approximate locations) of the tracking devices within a tracking device interface of the mobile device (for instance, within a map). In other embodiments, the locations of each tracking device in the scavenger hunt are not provided to the mobile device, and thus are not communicated to the user. In such embodiments, hints or clues regarding the location of each tracking device may be provided to the mobile device for display to the user.

The mobile device receives 710 a signal from a tracking device of the set of tracking devices while the mobile device is within the communicative range of or a threshold proximity of the tracking device. The received signal includes an identity of the tracking device, and can include additional information, such as information describing a task that must be performed or completed before the tracking device can be marked as found within the tracking device interface of the mobile device. The mobile device, in response to receiving the signal, can determine a location of the mobile device using location-detection functionality of the mobile device, and can provide the location of the mobile device and the identity of the tracking device to a central tracking server. The central tracking server can update a last known location of the tracking device to the received mobile device location.

The central tracking server can determine that the tracking device is part of the set of tracking devices (for instance, by comparing the received identity of the tracking device to a list of identities of the tracking devices within the set of tracking devices), and can cause the mobile device to display an indication or modify 720 a displayed representation of the tracking device to indicate that the tracking device has been found. In some embodiments, the mobile device can determine that the tracking device is part of the set of tracking devices independently of the central tracking system, and can modify 720 the displayed representation of the tracking device to indicate that the tracking device has been found. It should be noted that in some embodiments, before the displayed representation of the tracking device can be modified to indicate that the tracking device has been found, the mobile device or a user of the mobile device must complete a task associated with the tracking device. For instance, marking a tracking device as found might require solving a puzzle or riddle associated with the tracking device, reading a passage of text displayed by the mobile device, speaking to another person or hearing another person speak, perform a manual or physical task, and the like. Upon completing the task, a user may receive a code or unique identifier, and can provide the code or identifier to the central tracking system or within a tracking device application being executed by the mobile device in order to mark the tracking device as found. As such, the scavenger hunt can include a set of training exercises, a corporate meet-and-greet, or a team-building exercise that must be navigated before the scavenger hunt can be completed.

In response to each of the tracking devices within the set of tracking devices being found by the mobile device, the mobile device can display 730 an indication that the scavenger hunt has been completed. In some embodiments, the indication can be displayed in response to receiving an instruction from a central tracking server, while in other embodiments, the indication can be displayed by the mobile device independently of the central tracking server.

Additional Considerations

The foregoing description of the embodiments of the invention has been presented for the purpose of illustration; it is not intended to be exhaustive or to limit the invention to the precise forms disclosed. Persons skilled in the relevant art can appreciate that many modifications and variations are possible in light of the above disclosure.

Any of the devices or systems described herein can be implemented by one or more computing devices. A computing device can include a processor, a memory, a storage device, an I/O interface, and a communication interface, which may be communicatively coupled by way of communication infrastructure. Additional or alternative components may be used in other embodiments. In particular embodiments, a processor includes hardware for executing computer program instructions by retrieving the instructions from an internal register, an internal cache, or other memory or storage device, and decoding and executing them. The memory can be used for storing data or instructions for execution by the processor. The memory can be any suitable storage mechanism, such as RAM, ROM, flash memory, solid state memory, and the like. The storage device can store data or computer instructions, and can include a hard disk drive, flash memory, an optical disc, or any other suitable storage device. The I/O interface allows a user to interact with the computing device, and can include a mouse, keypad, keyboard, touch screen interface, and the like. The communication interface can include hardware, software, or a combination of both, and can provide one or more interfaces for communication with other devices or entities.

Some portions of this description describe the embodiments of the invention in terms of algorithms and symbolic representations of operations on information. These algorithmic descriptions and representations are commonly used by those skilled in the data processing arts to convey the substance of their work effectively to others skilled in the art. These operations, while described functionally, computationally, or logically, are understood to be implemented by computer programs or equivalent electrical circuits, microcode, or the like. Furthermore, it has also proven convenient at times, to refer to these arrangements of operations/as modules, without loss of generality. The described operations and their associated modules may be embodied in software, firmware, hardware, or any combinations thereof.

Any of the steps, operations, or processes described herein may be performed or implemented with one or more hardware or software modules, alone or in combination with other devices. In one embodiment, a software module is implemented with a computer program product comprising a computer-readable medium containing computer program code, which can be executed by a computer processor for performing any or all of the steps, operations, or processes described.

Embodiments of the invention may also relate to an apparatus for performing the operations herein. This apparatus may be specially constructed for the required purposes, and/or it may comprise a general-purpose computing device selectively activated or reconfigured by a computer program stored in the computer. Such a computer program may be stored in a non-transitory, tangible computer readable storage medium, or any type of media suitable for storing electronic instructions, which may be coupled to a computer system bus. Furthermore, any computing systems referred to in the specification may include a single processor or may be architectures employing multiple processor designs for increased computing capability.

Embodiments of the invention may also relate to a product that is produced by a computing process described herein. Such a product may comprise information resulting from a computing process, where the information is stored on a non-transitory, tangible computer readable storage medium and may include any embodiment of a computer program product or other data combination described herein.

Finally, the language used in the specification has been principally selected for readability and instructional purposes, and it may not have been selected to delineate or circumscribe the inventive subject matter. It is therefore intended that the scope of the invention be limited not by this detailed description, but rather by any claims that issue on an application based hereon. Accordingly, the disclosure of the embodiments of the invention is intended to be illustrative, but not limiting, of the scope of the invention, which is set forth in the following claims.

The invention claimed is:

1. A method for tracking the location of objects in a tracking device environment, comprising:
displaying, within a tracking device application of a mobile device, a representation for each of a set of tracking devices within a geographic area of an associated task that must be performed within a vicinity of the tracking device;
in response receiving a confirmation that a first task was performed within a vicinity of the tracking device associated with the first task, providing an indication to the tracking server that the first task has been completed; and
in response to receiving an indication from the tracking server that each of the the tasks have been completed in the vicinity of each associated tracking device, displaying, by the mobile device, an indication in the tracking device application that the tasks have been completed.

2. The method of claim 1, wherein the set of tracking devices are part of a scavenger hunt, and wherein the mobile device receives an indication from the tracking server that a user has completed the scavenger hunt in response to finding each of the set of tracking devices.

3. The method of claim 2, wherein the scavenger hunt includes a plurality of users, and wherein the received indication that the user has completed the scavenger hunt includes a rank or position of the user relative to other users of the plurality of users that have completed the scavenger hunt.

4. The method of claim 1, wherein displaying a representation for each of the set of tracking devices comprises displaying an icon corresponding to each of the tracking devices or corresponding to an object to which each tracking device is coupled.

5. The method of claim 1, wherein displaying a representation for each of the set of tracking devices comprises displaying information describing the task associated with the tracking device that must be completed by the user.

6. The method of claim 1, wherein the tracking server provides an approximate geographic location of each of the set of tracking devices, and wherein the mobile device is configured to display a representation of the approximate geographic location of each of the set of tracking devices within the tracking device interface.

7. The method of claim 5, wherein displaying the representation of the approximate geographic locations comprises displaying the approximate geographic locations within a map interface of the tracking device interface.

8. The method of claim 1, wherein each task comprises an action that must be performed by the user.

9. The method of claim 1, wherein each task comprises one of: a job training task, an educational task, and an entertainment task.

10. The method of claim 1, wherein each tracking device in the set of tracking devices is associated with a time range, and wherein the mobile device modifies the displayed representation of the tracking device within the tracking device interface to indicate that the tracking device has been found only if the received signal identifying the tracking device is received during the time range associated with the tracking device.

11. A non-transitory computer-readable storage medium storing instructions for tracking the location of objects in a tracking device environment, the instructions, when executed by a hardware processor, configured to cause the hardware processor to perform steps comprising:
displaying, within a tracking device application of a mobile device, a representation for each of a set of tracking devices within a geographic area of an associated task that must be performed within a vicinity of the tracking device;
in response receiving a confirmation that a first task was performed within a vicinity of the tracking device associated with the first task, providing an indication to the tracking server that the first task has been completed; and
in response to receiving an indication from the tracking server that each of the the tasks have been completed in the vicinity of each associated tracking device, displaying, by the mobile device, an indication in the tracking device application that the tasks have been completed.

12. The non-transitory computer-readable storage medium of claim 11, wherein the set of tracking devices are part of a scavenger hunt, and wherein the mobile device receives an indication from the tracking server that a user has completed the scavenger hunt in response to finding each of the set of tracking devices.

13. The non-transitory computer-readable storage medium of claim 12, wherein the scavenger hunt includes a plurality of users, and wherein the received indication that the user has completed the scavenger hunt includes a rank or position of the user relative to other users of the plurality of users that have completed the scavenger hunt.

14. The non-transitory computer-readable storage medium of claim 11, wherein displaying a representation for each of the set of tracking devices comprises displaying an icon corresponding to each of the tracking devices or corresponding to an object to which each tracking device is coupled.

15. The non-transitory computer-readable storage medium of claim 11, wherein displaying a representation for each of the set of tracking devices comprises displaying information describing the task associated with the tracking device that must be completed by the user.

16. The non-transitory computer-readable storage medium of claim 11, wherein the tracking server provides an approximate geographic location of each of the set of tracking devices, and wherein the mobile device is configured to display a representation of the approximate geographic location of each of the set of tracking devices within the tracking device interface.

17. The non-transitory computer-readable storage medium of claim 15, wherein displaying the representation of the approximate geographic locations comprises displaying the approximate geographic locations within a map interface of the tracking device interface.

18. The non-transitory computer-readable storage medium of claim 11, wherein each task comprises an action that must be performed by the user.

19. The non-transitory computer-readable storage medium of claim 11, wherein each task comprises one of: a job training task, an educational task, and an entertainment task.

20. The non-transitory computer-readable storage medium of claim 11, wherein each tracking device in the set of tracking devices is associated with a time range, and wherein the mobile device modifies the displayed representation of the tracking device within the tracking device interface to indicate that the tracking device has been found only if the received signal identifying the tracking device is received during the time range associated with the tracking device.

* * * * *